United States Patent
Bizen et al.

(10) Patent No.: US 11,610,756 B2
(45) Date of Patent: Mar. 21, 2023

(54) CHARGED PARTICLE BEAM APPARATUS AND CONTROL METHOD

(71) Applicant: Hitachi High-Tech Corporation, Tokyo (JP)

(72) Inventors: Kaori Bizen, Tokyo (JP); Ryota Watanabe, Tokyo (JP); Yuzuru Mizuhara, Tokyo (JP); Daisuke Bizen, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 40 days.

(21) Appl. No.: 17/497,384

(22) Filed: Oct. 8, 2021

(65) Prior Publication Data

US 2022/0115203 A1    Apr. 14, 2022

(30) Foreign Application Priority Data

Oct. 9, 2020 (JP) .............................. JP2020-171001

(51) Int. Cl.
*H01J 37/24*    (2006.01)
*H01J 37/147*    (2006.01)
(Continued)

(52) U.S. Cl.
CPC .......... *H01J 37/24* (2013.01); *H01J 37/1472* (2013.01); *H01J 37/222* (2013.01); *H01J 37/244* (2013.01);
(Continued)

(58) Field of Classification Search
CPC ............ H01J 37/00; H01J 37/02; H01J 37/24; H01J 37/1472; H01J 37/222; H01J 37/244;
(Continued)

(56) References Cited

U.S. PATENT DOCUMENTS

| 4,068,123 A | * | 1/1978 | Kokubo | .................. H01J 37/28 250/311 |
| 2007/0235659 A1 | * | 10/2007 | Pearl | ..................... H01J 37/263 250/397 |

(Continued)

FOREIGN PATENT DOCUMENTS

| JP | 4927506 B2 | 5/2012 |
| JP | 5948084 B2 | 7/2016 |
| JP | 2019-046642 A | 3/2019 |

*Primary Examiner* — Jason L McCormack
(74) *Attorney, Agent, or Firm* — Volpe Koenig

(57) ABSTRACT

A charged particle beam apparatus acquires an image that is not affected by movement of a stage at a high speed. The apparatus includes: a charged particle source for irradiating a sample with a charged particle beam; a stage on which the sample is placed; a measurement unit for measuring a movement amount of the stage; a deflector; a deflector offset control unit, which is a feedback control unit for adjusting a deflection amount of the deflector according to the movement amount of the stage; a plurality of detectors for detecting secondary charged particles emitted from the sample by irradiation of the charged particle beam; a composition ratio calculation unit that calculates composition ratios of signals output from the detectors based on the deflection amount adjusted by the feedback control unit; and an image generation unit for generating a composite image by compositing the signals using the composition ratio.

12 Claims, 11 Drawing Sheets

(51) Int. Cl.
    *H01J 37/244*    (2006.01)
    *H01J 37/22*     (2006.01)
    *H01J 37/28*     (2006.01)

(52) U.S. Cl.
    CPC ....... *H01J 37/28* (2013.01); *H01J 2237/1504* (2013.01); *H01J 2237/202* (2013.01); *H01J 2237/221* (2013.01); *H01J 2237/2448* (2013.01); *H01J 2237/24585* (2013.01)

(58) Field of Classification Search
    CPC .......... H01J 37/28; H01J 37/261; H01J 37/26; H01J 37/147; H01J 37/20; H01J 2237/1504; H01J 2237/202; H01J 2237/221; H01J 2237/2448; H01J 2237/24585; H01J 2237/15; H01J 2237/24495; H01J 2237/2826
    USPC .......................................... 250/306, 307, 311
    See application file for complete search history.

(56) References Cited

U.S. PATENT DOCUMENTS

| | | |
|---|---|---|
| 2015/0014531 A1 | 1/2015 | Yamazaki et al. |
| 2015/0074159 A1 | 3/2015 | Poschmann et al. |
| 2017/0301513 A1* | 10/2017 | Osaki .................... H01J 37/244 |

\* cited by examiner

EXECUTION OF CORRECTION

CHARGED PARTICLE BEAM APPARATUS AND CONTROL METHOD

CLAIM OF PRIORITY

The present application claims priority from Japanese patent application JP 2020-171001, filed on Oct. 9, 2020, the content of which is hereby incorporated by reference into this application.

BACKGROUND OF THE INVENTION

1. Field of the Invention

The present invention relates to a charged particle beam apparatus, and more particularly, to a technique for changing composition ratios of signals acquired by a plurality of detectors in accordance with a movement amount of a stage holding a sample.

2. Description of the Related Art

A charged particle beam apparatus such as an electron microscope or an ion microscope is used for observation of various samples having a fine structure. For example, for the purpose of process control in a manufacturing process of a semiconductor device, a scanning electron microscope, which is one of charged particle beam apparatuses, is applied to measurement such as dimensional measurement and defect inspection of a semiconductor device pattern formed on a semiconductor wafer as a sample.

In the dimensional measurement and the defect inspection of the semiconductor device pattern, the number of measurement points per unit time, that is, a throughput is important, and as a method for improving the throughput, there is a method in which a stage holding a wafer is moved at a high speed, and imaging is started before the stage is stopped. At this time, Japanese Patent No. 4927506 (PTL 1) discloses a method of acquiring an image without deviation even when the stage is not completely stopped by performing feedback control on a stage movement amount at a time of imaging adjusted by a deflector.

In addition, in recent years, three-dimensional formation of the semiconductor device is developed, and it is also important to take an image of a lower layer pattern with a high contrast in a dimensional measurement apparatus or a defect inspection apparatus of the semiconductor device pattern. Here, Japanese Patent No. 5948084 (PTL 2) discloses that angle discrimination is performed by selectively detecting secondary electrons in accordance with an emitted direction, and an image in which a shape of a lower layer is clear is generated. In particular, a method of performing the angle discrimination of the secondary electrons using an opening through which an electron beam emitted to the sample passes is disclosed.

When a stage drift correction method described in PTL 1 and an angle discrimination function by a plurality of detectors described in PTL 2 are simply combined, there is a problem that a detection signal amount of each detector changes according to the stage movement amount. A reason is that, in the stage drift correction method described in PTL 1, since it is necessary to apply a deflection field to the deflector in accordance with the stage movement amount, secondary charged particles generated in the wafer are deflected according to an amount of the deflection field, and an amount of the secondary charged particles reaching each detector fluctuates.

PTL 2 and JP-A-2019-46642 (PTL 3) disclose a method of adjusting a detection amount of the secondary charged particles by another deflector that controls a trajectory of the secondary charged particles according to the deflection field of the deflector. In a typical case where time of stage movement is as fast as milliseconds, there is a problem that a response of the deflector that changes the trajectory of the secondary charged particles is not in time, and the trajectory of the secondary charged particles cannot be controlled.

SUMMARY OF THE INVENTION

In order to solve the above problems, the invention provides a charged particle beam apparatus that includes: a charged particle source configured to irradiate a sample with a charged particle beam; a stage on which the sample is placed; a deflector configured to deflect the charged particle beam; a plurality of detectors configured to detect secondary charged particles emitted from the sample by irradiation of the charged particle beam; a feedback control unit configured to adjust a deflection amount of the charged particle beam specified by the deflector; and an image generation unit configured to calculate a composition ratio of each signal of the plurality of detectors based on the deflection amount adjusted by the feedback control unit, and generate a composite image by compositing the signals based on the composition ratio.

In order to solve the above problems, the invention provides a control method of a charged particle beam apparatus, the charged particle beam apparatus including: a charged particle source configured to irradiate a sample with a charged particle beam; a stage on which the sample is placed; a measurement unit configured to measure a movement amount of the stage; a deflector configured to deflect the charged particle beam; a plurality of detectors configured to detect secondary charged particles emitted from the sample by irradiation of the charged particle beam; a feedback control unit configured to adjust a deflection amount of the charged particle beam specified by the deflector; and an image generation unit, in which the feedback control unit adjusts the deflection amount of the charged particle beam according to the movement amount of the stage, and the image generation unit calculates a composition ratio of each signal of the plurality of detectors based on the deflection amount adjusted by the feedback control unit, and generates a composite image by compositing the signals based on the composition ratio.

By using the invention, an image that is not affected by a stage movement while the stage is being moved at a high speed can be acquired.

DESCRIPTION OF THE PREFERRED EMBODIMENTS

Hereinafter, embodiments of the invention will be described with reference to the drawings. The drawings illustrated in the present embodiment illustrate specific embodiments in accordance with principles of the invention, but the embodiment is provided for a purpose of understanding the invention, and is not to be used for limiting interpretation of the invention. In the following embodiments, a scanning electron microscope (SEM) that uses electrons as a charged particle source will be described as an example, but the same effect can be obtained even when various ions are used as the charged particle source.

First Embodiment

Figure 1:
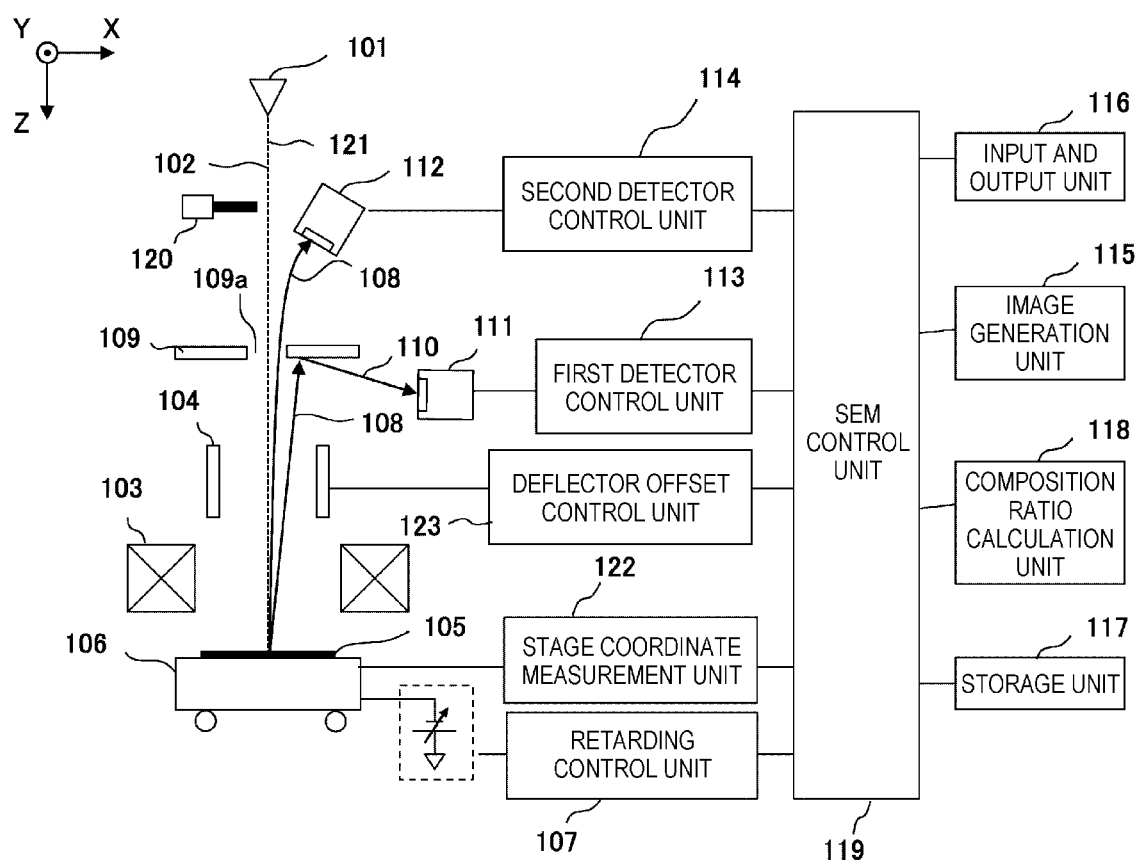
FIG. 1 is a configuration diagram of a charged particle beam apparatus according to a first embodiment.

An overall configuration of the scanning electron microscope according to the present embodiment will be described with reference to FIG. 1. In FIG. 1, a vertical direction is defined as a Z direction, and horizontal directions are defined as an X direction and a Y direction. The SEM includes an electron beam optical system that scans a sample with an electron beam, a stage mechanism system that holds the sample in a vacuum, a detection system that detects secondary electrons emitted from the sample by scanning the electron beam, and a control system that processes data output from each unit and controls each unit.

The electron beam optical system includes an electron beam source 101, an objective lens 103, a deflector 104, and a shutter 120. The electron beam source 101 is a beam source that irradiates a sample 105 with a primary electron beam 102 accelerated by a predetermined acceleration voltage. The objective lens 103 is a lens that converges the primary electron beam 102 on a surface of the sample 105. The deflector 104 is a coil or an electrode that generates a magnetic field or an electric field for deflecting the primary electron beam 102 in order to scan the surface of the sample 105.

A straight line that connects the electron beam source 101 and a center of the objective lens 103 is referred to as an optical axis 121, and the primary electron beam 102 not deflected by the deflectors 104 irradiates the sample 105 along the optical axis 121. The shutter 120 controls the irradiation of the primary electron beam 102 to the sample 105 by mechanically opening and closing the optical axis 121 or deflecting the primary electron beam 102 electrically or magnetically.

The stage mechanism system includes a movable stage 106. The movable stage 106 holds the sample 105 and moves the sample 105 in the X direction and the Y direction. A negative voltage lower than a ground voltage may be applied to the sample 105 held by the movable stage 106, and the primary electron beam 102 is subjected to a deceleration action by the applied negative voltage. Coordinates of the movable stage 106 are measured by a stage coordinate measurement unit 122. As an example of a configuration of the stage coordinate measurement unit 122, the coordinates of the movable stage 106 can be measured by irradiating the movable stage 106 with laser light and detecting the laser light reflected by the movable stage 106. This method is an example, and other methods may be used as long as the coordinates of the movable stage 106 can be measured.

The detection system includes a secondary electron diaphragm 109, a first detector 111, and a second detector 112. The secondary electron diaphragm 109 is, for example, a metal plate having a circular opening 109a, and a part of secondary electrons 108 emitted from the sample 105 passes through the opening 109a. Since an angle formed by a direction in which the secondary electrons 108 passing through the opening 109a is emitted from the sample 105 and the optical axis 121 is relatively small, the secondary electrons 108 are angle-discriminated depending on whether the secondary electrons 108 pass through the opening 109a. That is, the opening 109a is used for the angle discrimination of the secondary electrons 108 emitted from the sample 105.

A position of the opening 109a may be aligned with the optical axis 121 so that the primary electron beam 102 can pass through the opening 109a, or the opening 109a for the angle discrimination of the secondary electrons 108 may be provided separately from a hole through which the primary electron beam 102 passes. Hereinafter, a case where the position of the opening 109a of the secondary electron diaphragm 109 coincides with the optical axis 121 will be described.

The first detector 111 is a detector that is provided on a sample 105 side of the secondary electron diaphragm 109 and detects tertiary electrons 110 generated by the secondary electrons 108 colliding with the secondary electron diaphragm 109. That is, the first detector 111 indirectly detects the secondary electrons 108 that do not pass through the opening 109a of the secondary electron diaphragm 109 by detecting the tertiary electrons 110.

The second detector 112 is a detector that is provided on an electron beam source 101 side of the secondary electron diaphragm 109 and detects the secondary electrons 108 passing through the opening 109a. As the first detector 111 and the second detector 112, an E-T detector or a semiconductor detector including a scintillator, a light guide, and a photomultiplier tube may be used, or a detector having another configuration may be used. For example, the secondary electron diaphragm 109 may function as the first detector 111 by configuring the secondary electron diaphragm 109 with a circular ring shaped semiconductor detector or a michro-channel plate (MCP).

The control system includes a retarding control unit 107, a first detector control unit 113, a second detector control unit 114, an image generation unit 115, an input and output unit 116, a storage unit 117, a composition ratio calculation unit 118, a deflector offset control unit 123, and an SEM control unit 119.

The retarding control unit 107 is a circuit that controls the negative voltage applied to the sample 105 on the movable stage 106. The deflector offset control unit 123 is a feedback control unit that applies an offset current or an offset voltage to the deflector 104 based on a movement amount of the movable stage 106 measured by the stage coordinate measurement unit 122. The first detector control unit 113 and the second detector control unit 114 are circuits that respectively control the first detector 111 and the second detector 112 and adjust a gain and an offset.

The image generation unit 115 is an arithmetic unit that generates an image based on a first signal output from the first detector 111 or a second signal output from the second detector 112, and is, for example, a micro processing unit (MPU), a graphics processing unit (GPU), or the like.

The input and output unit 116 is a device that inputs an observation condition that is a condition for observing the sample 105, and displays the image generated by the image generation unit 115, and is, for example, a keyboard, a mouse, a touch panel, a liquid crystal display, or the like.

The storage unit 117 is a device that stores various types of data and programs, for example, a hard disk drive (HDD) or a solid state drive (SSD). The storage unit 117 stores a program executed by the SEM control unit 119 or the like, the observation condition input from the input and output unit 116, the image generated by the image generation unit 115, or the like.

The composition ratio calculation unit 118 is an arithmetic unit that calculates a synthesis ratio used when the image generation unit 115 generates a composite image by synthesizing the first signal and the second signal, and is configured with, for example, an MPU or the like. A flow of processing of calculating the composition ratio will be described later with reference to FIG. 3.

The SEM control unit 119 is an arithmetic unit that controls each unit and processes or transmits data generated in each unit, and is, for example, a central processing unit (CPU), an MPU, or the like. The CPU, the MPU, or the like of the SEM control unit 119 can also serve as the CPU, the MPU, or the like of the image generation unit 115, the MPU of the composition ratio calculation unit 118, or the like.

In the present embodiment, after the movable stage 106 is moved to a desired observation place of the sample 105, a drift amount drifting without completely stopping the movable stage 106 is measured by the stage coordinate measurement unit 122, the offset current or the offset voltage is output from the deflector offset control unit 123 according to the drift amount, and the composition ratio corresponding to output of the offset current or the offset voltage is calculated in the composition ratio calculating unit 118. A specific processing flow will be described with reference to FIGS. 2 and 3. This processing includes a determination of a correction function illustrated in FIG. 2 and an execution of a correction illustrated in FIG. 3.

Figure 2:
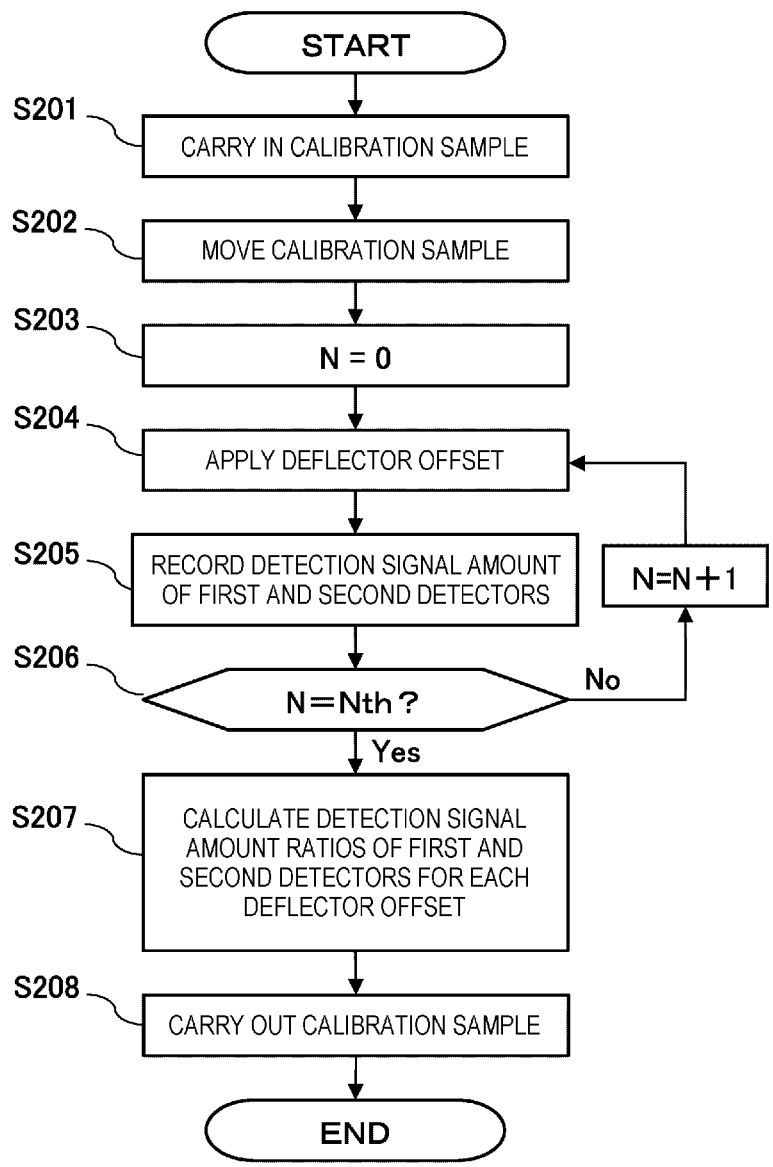
FIG. 2 is a diagram illustrating a flow for determining a correction function according to the first embodiment.

<FIG. 2: Determination of Correction Function>
(S201)
A calibration sample, which is the sample 105 having a flat surface, is held by the movable stage 106 and carried into the scanning electron microscope. It is preferable that the calibration sample not only has the flat surface, but also is made of a homogeneous material. For example, a bare wafer made of silicon is used as the calibration sample.
(S202)
The movable stage 106 moves the calibration sample such that the flat surface is disposed in a field of view. At this time, in order to prevent contamination, it is desirable to move the sample to a place different from the place used when a previous correction function is determined.
(S203)
The SEM control unit 119 sets N=0, opens the shutter 120, and starts irradiating the calibration sample with the primary electron beam 102. N is the number of deflector offsets for performing the measurement.
(S204)
The deflector offset control unit 123 outputs N×ΔD, which is the offset current or the offset voltage, to the deflector 104. At this time, an amount ΔD of the offset current or the offset voltage to be output is recorded in the storage unit 117.
(S205)
The first signal output from the first detector 111 and the second signal output from the second detector 112 are recorded in the storage unit 117.
(S206)
The SEM control unit 119 determines whether a value of N reaches a predetermined threshold value Nth. When the value of N does not reach the threshold value Nth, the processing proceeds to S204, and when the value of N reaches the threshold value Nth, the processing proceeds to S207.
(S207)
The SEM control unit 119 calculates detection signal amount ratios of the first and second detectors from the first signal and the second signal for each deflector offset recorded in the storage unit 117. Specifically, assuming that the first signal is $I_1$, the second signal is $I_2$, the detection signal amount ratio of the first detector is $P_1$, and the detection signal amount ratio of the second detector is $P_2$, the following formula (1) is determined.

$$P_1 = \frac{I_1}{I_1 + I_2}, P_2 = \frac{I_2}{I_1 + I_2} \quad (1)$$

The determined detection signal amount ratios $P_1$ and $P_2$ are recorded in the storage unit 117.
(S208)
The calibration sample held on the movable stage 106 is carried out to the outside of the scanning electron microscope, and the processing is ended.

Figure 3:
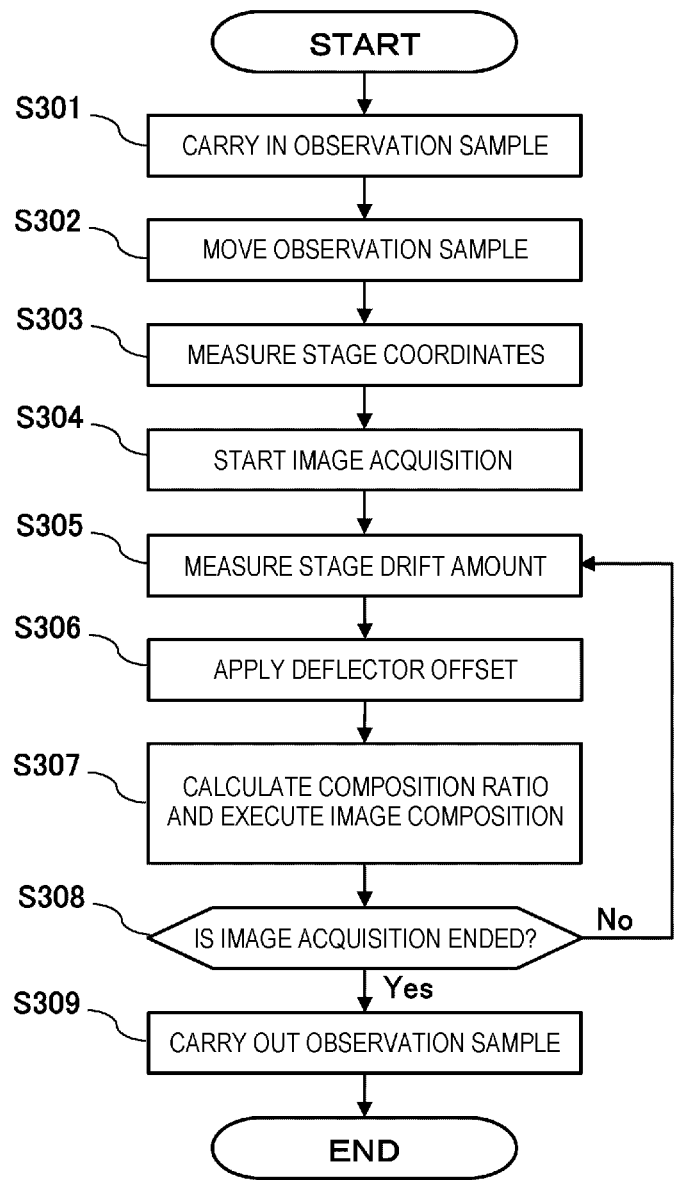
FIG. 3 is a diagram illustrating a flow for executing correction according to the first embodiment.

<FIG. 3: Execution of Correction>
(S301)
An observation sample, which is the sample 105 desired to be observed by a user, is held on the movable stage 106 and carried into the scanning electron microscope.
(S302)
The movable stage 106 moves the observation sample to coordinates desired to be observed by the user.
(S303)
The coordinates of the movable stage 106 immediately after the movement to the observation place are measured by the stage coordinate measurement unit 122.
(S304)
Image acquisition is started. At this time, a scanning speed of the primary electron beam 102, the number of frame integrations, the number of pixels, a magnification, or the like are input by the user from the input and output unit 116.
(S305)
The coordinates of the movable stage 106 are measured by the stage coordinate measurement unit 122, and a difference from the coordinates measured in S303 is used as a stage drift amount.
(S306)
In accordance with the stage drift amount determined in S305, the offset current or the offset voltage is output from the deflector offset control unit 123 to the deflector 104.
(S307)
The composition ratios of the first signal and the second signal are calculated by the composition ratio calculation unit 118 in accordance with the offset current or the offset voltage of the deflector output in S306, and the composite image is generated by the image generation unit 115.
(S308)
The SEM control unit 119 determines whether the image acquisition is completed. If the image acquisition is not completed, the processing proceeds to S305, and if the image acquisition is completed, the processing proceeds to S309.

(S309)

The observation sample held on the movable stage 106 is carried out to the outside of the scanning electron microscope, and the processing is ended.

The processed composite image is recorded in the storage unit 117. In addition, a value of the offset current or the offset voltage and the composition ratio calculated by the composition ratio calculation unit 118 are also recorded in the storage unit 117 as additional information of the composite image. Then, the composite image and the additional information can be confirmed by the input and output unit 116 when desired by the user.

According to the flow of the processing described above, detection rate fluctuations of the first detector and the second detector are corrected according to the offset current or the offset voltage applied to the deflector 104 based on the stage drift amount of the movable stage 106. Therefore, even when the stage drifts, a homogeneous composite image is generated. The processings of S305 to S307 may be performed during the frame integrations or may be performed in one line scan of the primary electron beam 102.

Second Embodiment

In the first embodiment, a method of correcting fluctuations in detection rates of the first detector and the second detector according to the offset current or the offset voltage applied to the deflector 104 according to the stage drift amount of the movable stage 106 is illustrated. A fluctuation amount of the detection rates according to the offset current or the offset voltage fluctuates depending on conditions such as a height (Z coordinate) and an inclination of the sample 105, and an irradiation energy of the primary electron beam 102 on the sample 105. Therefore, in the present embodiment, an embodiment of a control method for correcting the fluctuation amount of the detection rates for each of these conditions will be disclosed.

Figure 4:
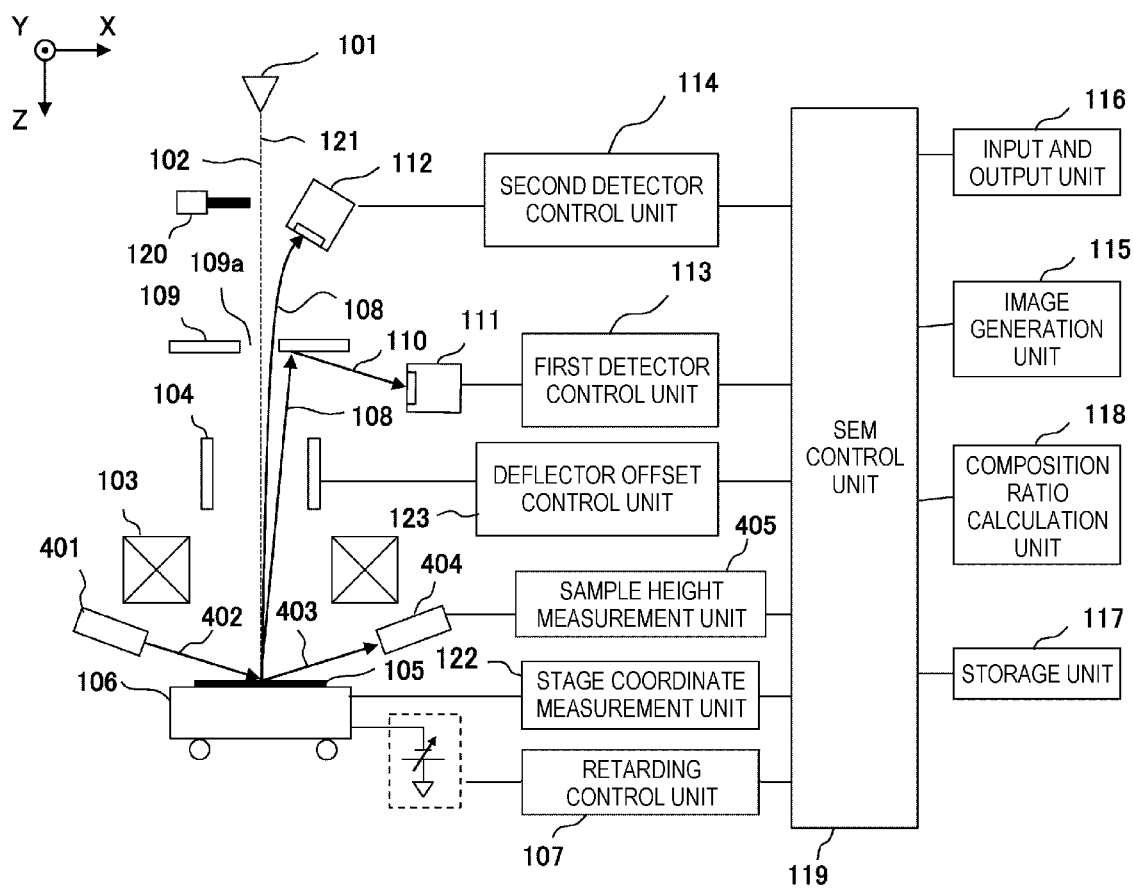
FIG. 4 is a configuration diagram of a charged particle beam apparatus according to a second embodiment.

As an example, FIG. 4 illustrates a device configuration for correcting the fluctuation amount of the detection rates for each height (Z coordinate) of the sample 105. In this configuration, a light irradiation unit 401, a light detection unit 404, and a sample height measurement unit 405 are added to the configuration of FIG. 1. Incident light 402 is emitted from the light irradiation unit 401 toward the sample 105. Reflected light 403 reflected by the sample 105 is detected by the light detection unit 404. The sample height measurement unit 405 measures the Z coordinate of the sample 105 by using a fact that a position of the reflected light 403 in the light detection unit 404 changes in accordance with the Z coordinate of the sample 105.

Figure 5:
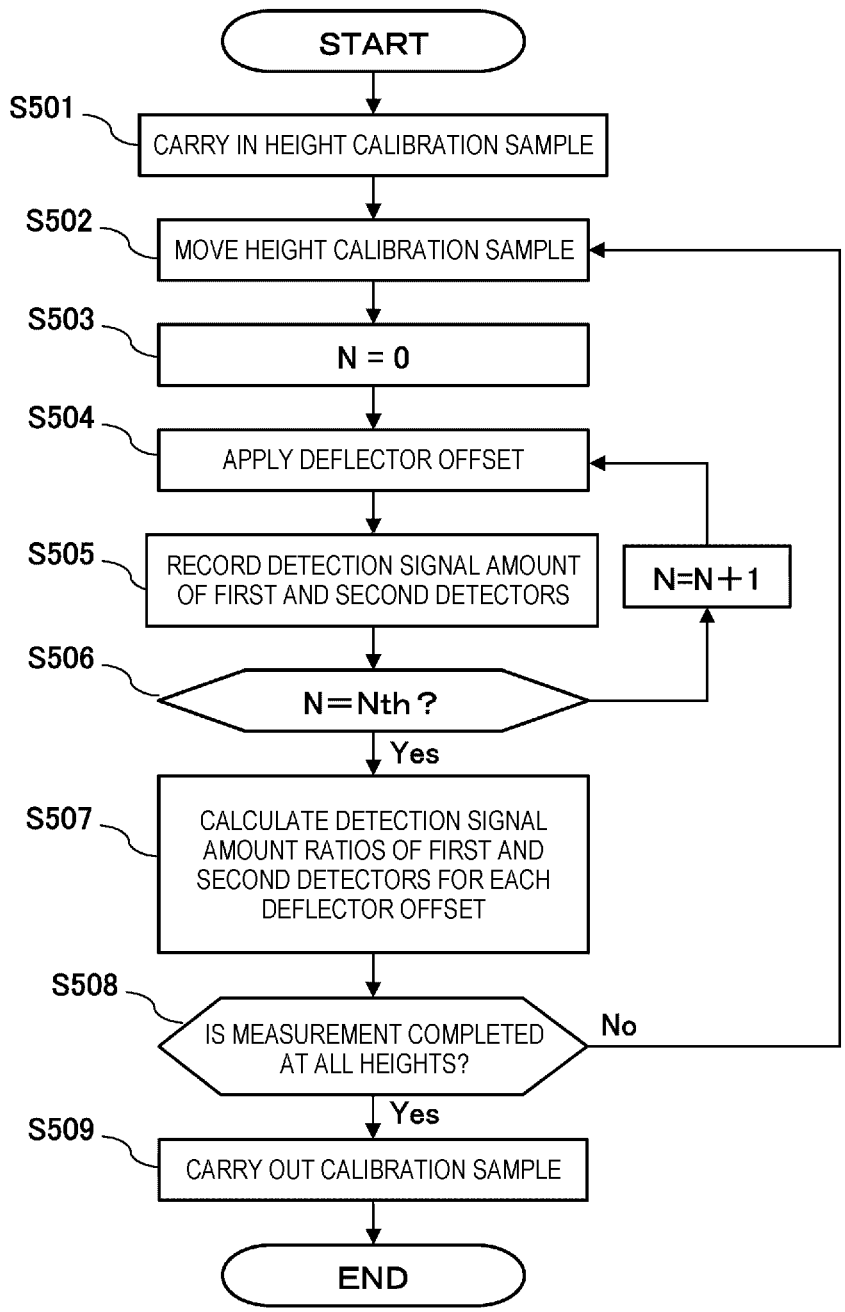
FIG. 5 is a diagram illustrating a flow for determining a correction function according to the second embodiment.

A method of determining the correction function by using the device configuration of FIG. 4 is illustrated in FIG. 5.
<FIG. 5: Determination of Correction Function>
(S501)

A height calibration sample having a plurality of heights is held by the movable stage 106 and carried into the scanning electron microscope. It is preferable that the calibration sample not only has the flat surface, but also is made of the homogeneous material.

(S502 to S507)

Steps S502 to S507 are the same as steps S202 to S207 in FIG. 2.

(S508)

The SEM control unit 119 determines whether the measurement is completed at all heights prepared in the height calibration sample carried in in S501. When the measurement is not completed at all the heights, the processing proceeds to S502, and when the measurement is completed, the processing proceeds to S509.

(S509)

Figure 6:
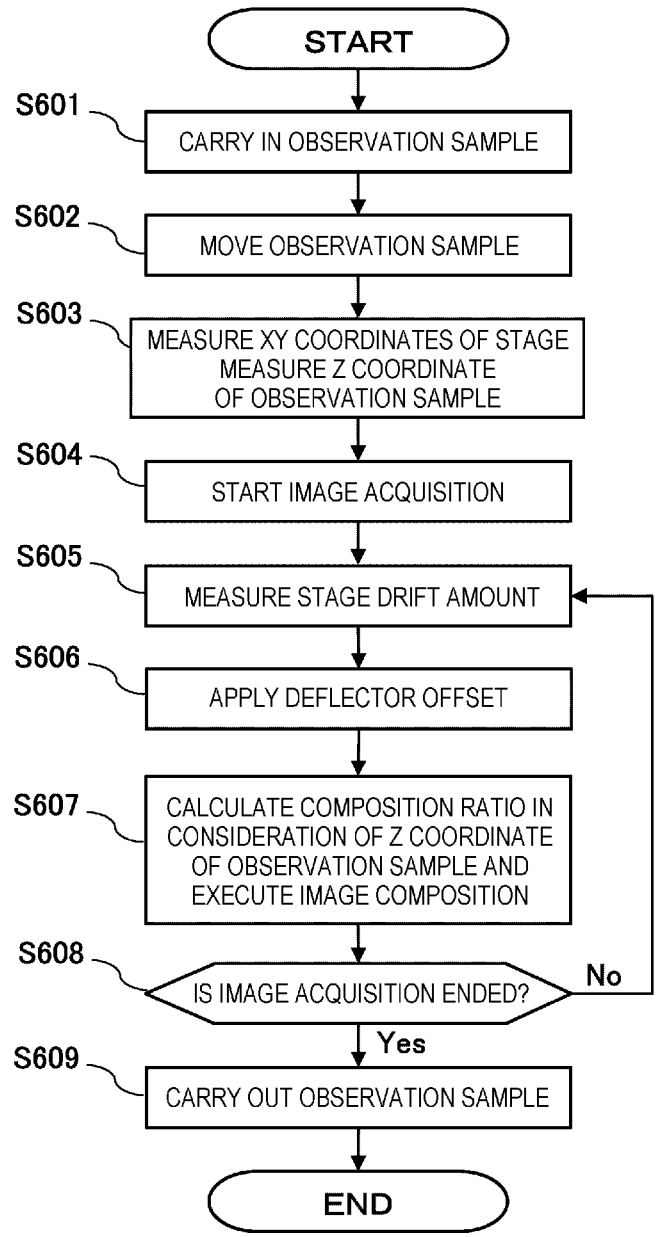
FIG. 6 is a diagram illustrating a flow for executing correction according to the second embodiment.

The height calibration sample held on the movable stage 106 is carried out of the scanning electron microscope, and the processing is ended. Through the above processing, the correction function can be determined for each height of the sample 105.
<FIG. 6: Execution of Correction>
(S601, S602)

Steps S601 and S602 are the same as steps S301 and S302 in FIG. 3.

(S603)

XY coordinates of the movable stage 106 immediately after the movement to the observation place are measured by the stage coordinate measurement unit 122, and the Z coordinate of the sample 105 is measured by the sample height measurement unit 405, respectively.

(S604 to S606)

Steps S604 to S606 are the same as steps S304 to S306 in FIG. 3.

(S607)

The composition ratios of the first signal and the second signal are calculated by the composition ratio calculation unit 118 according to the Z coordinate of the observation sample measured in S603 and the offset current or the offset voltage output in S306, and the composite image is generated by the image generation unit 115.

(S608, S609)

Steps S608 and S609 are the same as steps S308 and S309 in FIG. 3.

By the above processing, in consideration of the height of the sample 105, the detection rate fluctuations of the first detector and the second detector according to the offset current or the offset voltage applied to the deflector 104 according to the stage drift amount of the movable stage 106 are corrected.

As described above, a detection rate fluctuation correction method in a case where the height of the sample 105 is taken into consideration is described, but the method disclosed herein can also be applied to a parameter fluctuation other than the height of the sample 105. For example, instead of measuring the height of the sample 105 in FIG. 4, a sensor (not illustrated) for measuring the inclination of the sample 105 may be mounted. In the flow of determining the correction function of FIG. 5, the correction function may be determined using calibration samples having different inclinations. In the flow of executing the correction of FIG. 6, the composition ratio may be determined from the inclination of the observation sample.

These correction functions may be determined for each incident energy or incident angle of the primary electron beam 102 on the sample 105, or may be determined using a value of an environment sensor such as a temperature or an atmospheric pressure of an environment in which the scanning electron microscope is installed. That is, the value of the sensor for measuring at least one of the height of the sample, the inclination of the sample, the incident energy of the charged particle beam on the sample, the incident angle of the charged particle beam on the sample, the temperature of the environment where the charged particle beam apparatus is installed, and the atmospheric pressure of the environment where the charged particle beam apparatus is installed may be used.

Third Embodiment

Figure 7:
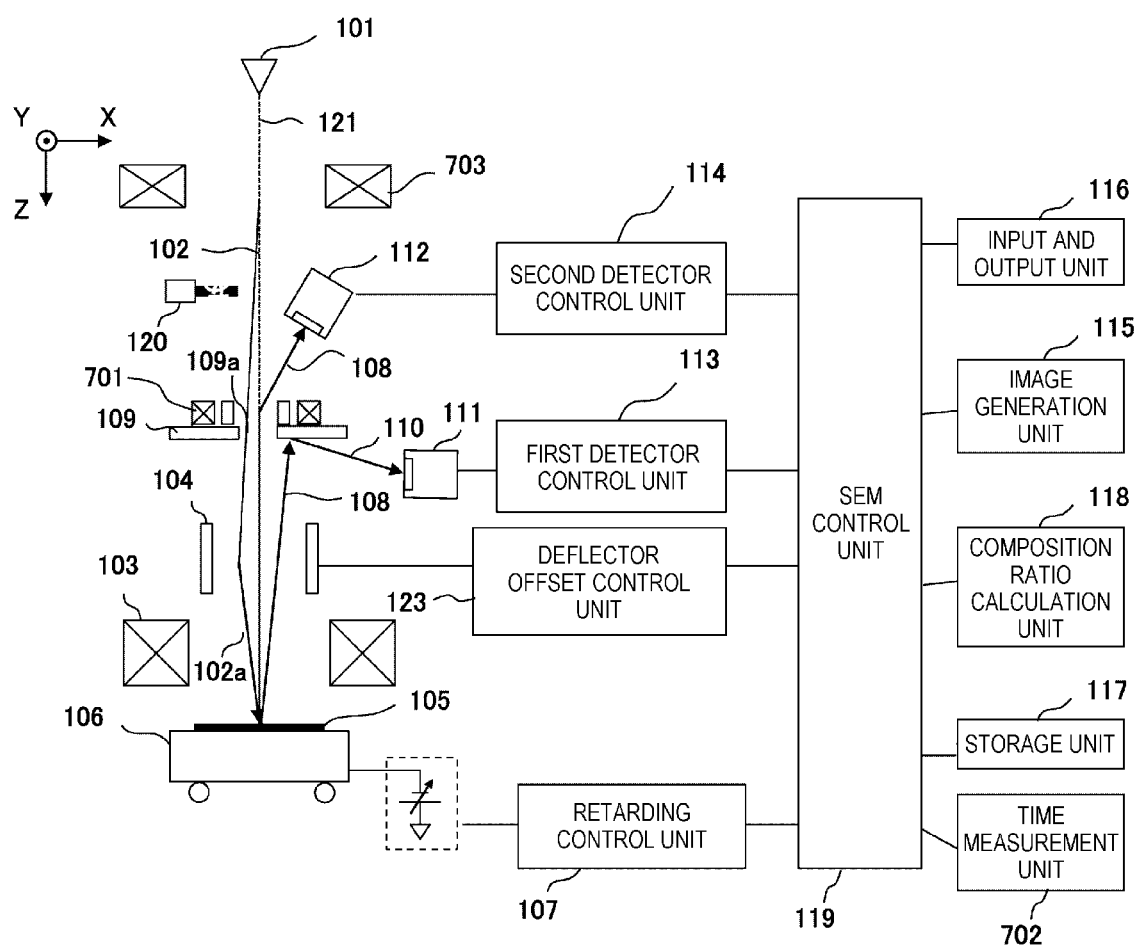
FIG. 7 is a configuration diagram of a charged particle beam apparatus according to a third embodiment.

The present disclosure can be applied to a case where the offset current or the offset voltage is applied from the deflector offset control unit 123 to the deflector 104, in addition to correcting the drift of the movable stage 106 by the deflector offset control unit 123. Specifically, the configuration of the charged particle beam apparatus of the third embodiment illustrated in FIG. 7 is considered. With respect to the configuration of FIG. 1, in the configuration of the third embodiment, the stage coordinate measurement unit 122 is eliminated, and instead, a secondary electron deflector 701, a converging lens 703, and a time measurement unit 702 are added. The secondary electron deflector 701 is an optical element in which a magnetic field and an electric field are orthogonal to each other, and has a function of causing the primary electron beam 102 to travel straight and the secondary electrons 108 to deflect. The converging lens 703 has an effect of converging the primary electron beam 102.

In the secondary electron deflector 701 and the converging lens 703, a field that acts on the primary electron beam 102 may change due to a change in an apparatus installation environment, stability of a power supply, and a change in an operation environment. For example, a primary electron beam 102a is deflected by the converging lens 703. A trajectory of the deflected primary electron beam 102a can be swung back by applying the offset current or the offset voltage from the deflector offset control unit 123 to the deflector 104.

Here, an amount of the offset current or the offset voltage required to swing the deflected primary electron beam 102a back is a function of elapsed time from a time at which operating conditions of the secondary electron deflector 701 and operating conditions of the converging lens 703 are determined to the present. The time at which the operating conditions of the secondary electron deflector 701 and the operating conditions of the converging lens 703 are determined is set as a reference time, and the elapsed time from the reference time to the present is measured by the time measurement unit 702.

The offset current or the offset voltage output from the deflector offset control unit 123 with respect to the elapsed time from the reference time is determined in advance by a designer of an apparatus and stored in the storage unit 117. In addition, the designer of the apparatus determines in advance when to set the reference time.

Figure 8:
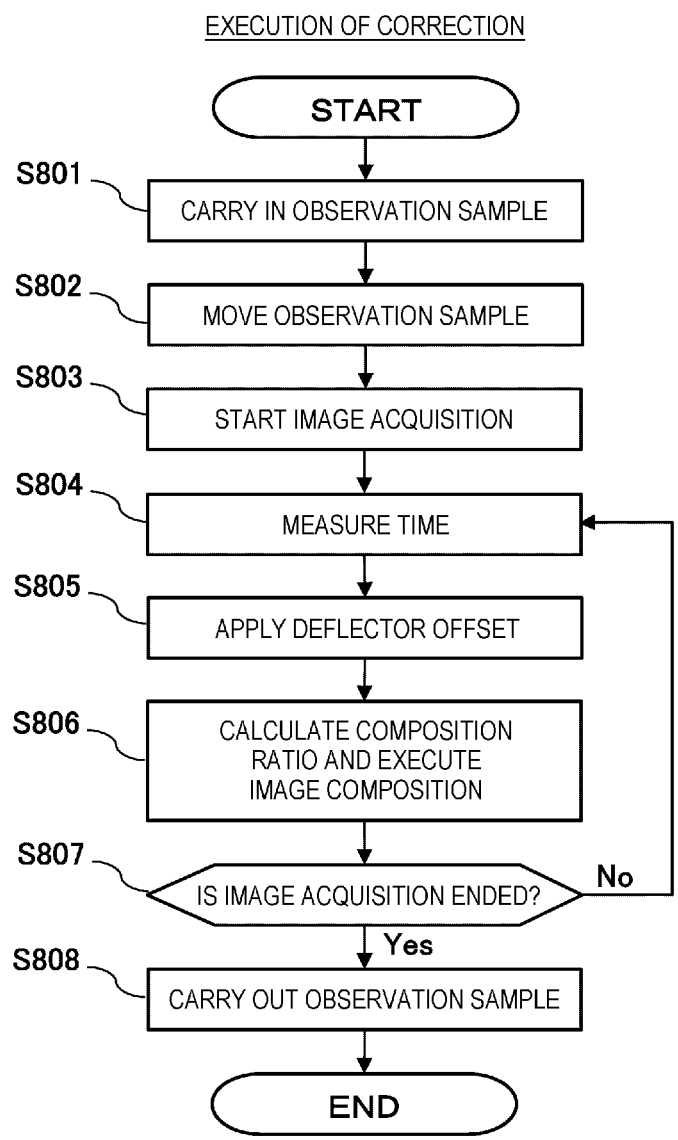
FIG. 8 is a diagram illustrating a flow for executing correction according to the third embodiment.

As the correction function of the detection rate, one determined by the flow illustrated in FIG. 2 can be used. FIG. 8 illustrates a flow of executing the correction.
<FIG. 8: Execution of Correction>
(S801 to S803)
Steps S801 to S803 are the same as steps S301, S302 and S304 in FIG. 3.
(S804)
The time measurement unit 702 measures a current time, and calculates the elapsed time from the reference time.
(S805)
In accordance with the elapsed time determined in S804, the offset current or the offset voltage is output from the deflector offset control unit 123 to the deflector 104.
(S806)
The composition ratios of the first signal and the second signal are calculated by the composition ratio calculation unit 118 in accordance with the offset current or the offset voltage output in S805, and the composite image is generated by the image generation unit 115.
(S807)
The SEM control unit 119 determines whether the image acquisition is completed. If the image acquisition is not completed, the processing proceeds to S804, and if the image acquisition is completed, the processing proceeds to S808.
(S808)
The observation sample held on the movable stage 106 is carried out to the outside of the scanning electron microscope, and the processing is ended.

According to the above processing, the fluctuation of the detection rate can be corrected while the primary electron beam 102a deflected with elapse of the time is swung back.

Fourth Embodiment

In the first, second, and third embodiments, the composition ratios of the first signal and the second signal calculated by the composition ratio calculation unit 118 are changed depending on the offset current or the offset voltage output from the deflector offset control unit 123. However, the same effect can be obtained by adjusting the gain and the offset in the first detector control unit 113 and the second detector control unit 114 by setting the composition ratio determined by the composition ratio calculation unit 118 to a constant value.

Figure 9:
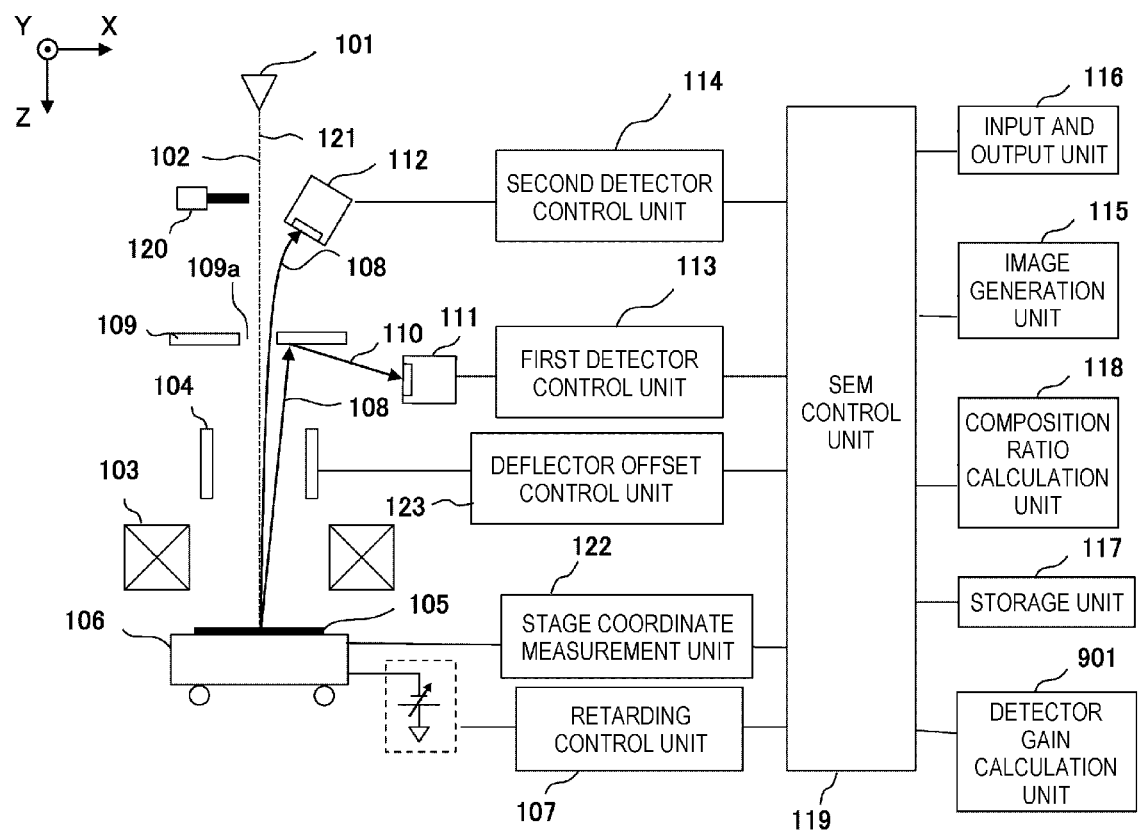
FIG. 9 is a configuration diagram of a charged particle beam apparatus according to a fourth embodiment.

Specifically, as illustrated in FIG. 9, the gain and the offset corresponding to the offset current or the offset voltage output from the deflector offset control unit 123 can be calculated by a detector gain calculation unit 901 and set in the first detector control unit 113 and the second detector control unit 114.

Figure 10:
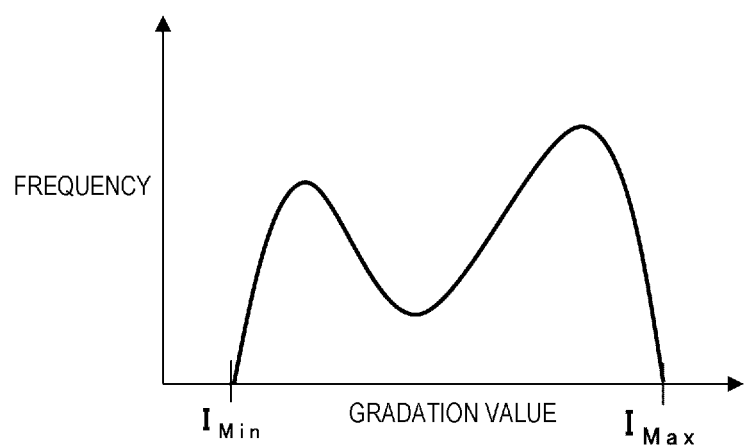
FIG. 10 is a diagram illustrating an example of a histogram in an image according to the fourth embodiment.

Normally, the gain and the offset determined by the first detector control unit 113 and the second detector control unit 114 are adjusted such that a minimum gradation value $I_{Min}$ and a maximum gradation value $I_{Max}$ are predetermined values in the histogram illustrated in FIG. 10 of the images acquired by the first detector 111 and the second detector 112, respectively.

However, in the present embodiment, the minimum gradation value $I_{Min}$ and the maximum gradation value $I_{Max}$ in the first detector 111 and the second detector 112 fluctuate according to the detection signal amount ratio $P_1$ of the first detector and the detection signal amount ratio $P_2$ of the second detector determined in S207 of FIG. 2, and the gain and the offset are determined by the first detector control unit 113 and the second detector control unit 114 such that the fluctuating minimum gradation value $I_{Min}$ and the maximum gradation value $I_{Max}$ can be realized. A relationship between the detection signal amount ratio $P_1$ of the first detector, the detection signal amount ratio $P_2$ of the second detector, and the minimum gradation value $I_{Max}$ and the maximum gradation value $I_{Max}$ is determined in advance by the designer and stored in the storage unit 117.

Figure 11:
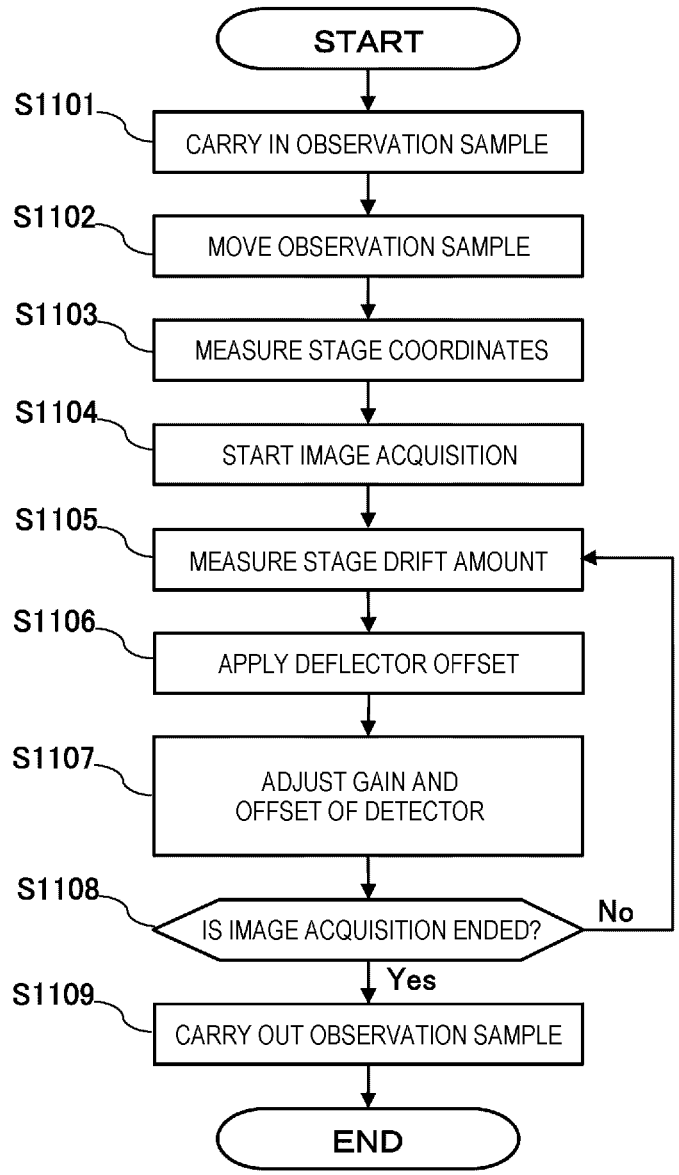
FIG. 11 is a diagram illustrating a flow for executing correction according to the fourth embodiment.

As the detection signal amount ratio $P_1$ of the first detector and the detection signal amount ratio $P_2$ of the second detector, those determined by the flow illustrated in FIG. 2 can be used. FIG. 11 illustrates a flow of executing the correction of the present embodiment.

<FIG. 11: Execution of Correction>
(S1101 to S1106, S1108, S1109)

Steps S1101 to S1106, S1108 and S1109 are the same as steps S301 to S306, S308 and S309 in FIG. 3.

(S1107)

According to the offset current or the offset voltage output in S1106, the gain and the offset are adjusted by the first detector control unit 113 and the second detector control unit 114, and the composite image is generated by the image generation unit 115 at the composition ratio in which the obtained first signal and second signal are predetermined.

As described above, in the present embodiment, the gain and the offset determined by the first detector control unit 113 and the second detector control unit 114 are adjusted, and it is possible to acquire an image in which the detection rate that fluctuates depending on the offset current or the offset voltage output from the deflector offset control unit 123 is corrected.

The invention is not limited to the embodiments described above and further includes various modifications. For example, the embodiments described above have been described in detail for easy understanding of the invention, and the invention is not necessarily limited to those including all configurations described above. A part of a configuration of one embodiment can be replaced with a configuration of another embodiment, and a configuration of another embodiment can be added to a configuration of one embodiment. In a part of a configuration of each embodiment, the configuration of the other embodiment can be added, removed, or replaced.

Further, although an example of creating a program for implementing a part or all of the configurations, functions, and control units described above is mainly described, it is needless to say that a part or all of them may be implemented by hardware, for example, by designing an integrated circuit. That is, all or a part of the functions of the processing units may be implemented by the integrated circuit such as an application specific integrated circuit (ASIC) or a field programmable gate array (FPGA) instead of the program.

What is claimed is:

1. A charged particle beam apparatus, comprising:
a charged particle source configured to irradiate a sample with a charged particle beam;
a stage on which the sample is placed;
a deflector configured to deflect the charged particle beam;
a plurality of detectors configured to detect secondary charged particles emitted from the sample by irradiation of the charged particle beam;
a feedback control unit configured to adjust a deflection amount of the charged particle beam specified by the deflector; and
an image generation unit configured to calculate composition ratios of signals of the plurality of detectors based on the deflection amount adjusted by the feedback control unit, and generate a composite image by compositing the signals based on the composition ratios.

2. The charged particle beam apparatus according to claim 1, further comprising:
a measurement unit configured to measure a movement amount of the stage, wherein
the feedback control unit adjusts the deflection amount of the charged particle beam according to the movement amount of the stage.

3. The charged particle beam apparatus according to claim 2, further comprising:
a storage unit, wherein
a relationship between the deflection amount adjusted by the feedback control unit and the composition ratios is determined in advance using a calibration sample, and is stored in the storage unit.

4. The charged particle beam apparatus according to claim 3, wherein
the deflection amount and the composition radios of the signals at a time of generation of the composite image are recorded in the storage unit as additional information of the composite image.

5. The charged particle beam apparatus according to claim 2, wherein
processing of generating the composite image in the image generation unit is performed every one-line scan or one-frame scan of the charged particle beam by the deflector.

6. The charged particle beam apparatus according to claim 2, further comprising:
a sensor configured to measure at least one of a height of the sample, an inclination of the sample, an incident energy of the charged particle beam on the sample, an incident angle of the charged particle beam on the sample, a temperature of an environment where the charged particle beam apparatus is installed, and an atmospheric pressure of the environment where the charged particle beam apparatus is installed, wherein
composition ratios of the signals output from the plurality of detectors are calculated based on a result measured by the at least one of the sensors, in addition to the deflection amount adjusted by the feedback control unit.

7. The charged particle beam apparatus according to claim 1, further comprising:
a secondary charged particle deflector configured to deflect secondary charged particles emitted from the sample by the irradiation of the charged particle beam or a converging lens configured to converge the charged particle beam installed between the plurality of detectors and the charged particle source; and
a time measurement unit configured to measure time, wherein
elapsed time, which is a difference between a reference time and a current time, is measured by the time measurement unit, and
the deflection amount of the charged particle beam specified by the deflector is adjusted by the feedback control unit according to the elapsed time.

8. The charged particle beam apparatus according to claim 7, wherein
the reference time is a time when an operating condition of the secondary charged particle deflector or an operating condition of the converging lens is determined, or a time when a deflection field generated by the secondary charged particle deflector or a deflection field generated by the converging lens is changed.

9. The charged particle beam apparatus according to claim 1, further comprising:
a detector control unit configured to adjust an amount of a gain and an offset in the plurality of detectors; and
a detector gain calculation unit configured to calculate the amount of the gain and the offset set by the detector control unit based on the deflection amount adjusted by the feedback control unit, wherein the image generation unit composites the signals output from the plurality of detectors at constant composition ratios.

10. A control method of a charged particle beam apparatus,
the charged particle beam apparatus including:
a charged particle source configured to irradiate a sample with a charged particle beam;
a stage on which the sample is placed;
a measurement unit configured to measure a movement amount of the stage;
a deflector configured to deflect the charged particle beam;
a plurality of detectors configured to detect secondary charged particles emitted from the sample by irradiation of the charged particle beam;
a feedback control unit configured to adjust a deflection amount of the charged particle beam specified by the deflector; and
an image generation unit,
the control method comprising:
adjusting the deflection amount of the charged particle beam according to the movement amount of the stage by the feedback control unit; and
calculating composition ratios of signals of the plurality of detectors based on the deflection amount adjusted by the feedback control unit, and generating a composite image by compositing the signals based on the composition ratios by the image generation unit.

11. The control method of a charged particle beam apparatus according to claim 10, further comprising:
determining in advance a relationship between the deflection amount adjusted by the feedback control unit and the composition ratios using a calibration sample.

12. The control method of a charged particle beam apparatus according to claim 11, wherein
the charged particle beam apparatus further includes:
a sensor configured to measure at least one of a height of the sample, an inclination of the sample, an incident energy of the charged particle beam on the sample, an incident angle of the charged particle beam to the sample, a temperature of an environment where the charged particle beam apparatus is installed, and an atmospheric pressure of the environment where the charged particle beam apparatus is installed, and
the control method includes:
calculating composition ratios of the signals output from the plurality of detectors based on a result measured by the at least one of the sensors, in addition to the deflection amount adjusted by the feedback control unit.

* * * * *